(12) United States Patent
Ingino et al.

(10) Patent No.: US 6,809,547 B2
(45) Date of Patent: Oct. 26, 2004

(54) MULTI-FUNCTION INTERFACE AND APPLICATIONS THEREOF

(75) Inventors: Joseph Ingino, New York, NY (US); Vincent Von Kaenel, Palo Alto, CA (US)

(73) Assignee: Broadcom, Corp., Irvine, CA (US)

( * ) Notice: Subject to any disclaimer, the term of this patent is extended or adjusted under 35 U.S.C. 154(b) by 0 days.

(21) Appl. No.: 10/305,648

(22) Filed: Nov. 27, 2002

(65) Prior Publication Data

US 2003/0117166 A1 Jun. 26, 2003

Related U.S. Application Data

(60) Provisional application No. 60/419,044, filed on Oct. 16, 2002.

(51) Int. Cl.$^7$ ............................................. H03K 19/003
(52) U.S. Cl. .............................. 326/30; 326/86; 326/83; 326/90; 710/2; 710/8; 710/104
(58) Field of Search .............................. 326/30, 86, 90, 326/56–58, 87, 83; 710/2, 8, 10, 104, 302, 305

(56) References Cited

U.S. PATENT DOCUMENTS

| | | | | |
|---|---|---|---|---|
| 5,585,763 A | * | 12/1996 | Navabi et al. | 330/255 |
| 5,793,997 A | * | 8/1998 | Briggs | 710/305 |
| 6,023,736 A | * | 2/2000 | Lambeth et al. | 710/10 |
| 6,329,836 B1 | * | 12/2001 | Drost et al. | 326/30 |
| 6,424,175 B1 | * | 7/2002 | Vangal et al. | 326/82 |

* cited by examiner

*Primary Examiner*—Vibol Tan
(74) *Attorney, Agent, or Firm*—Timothy W. Markison

(57) ABSTRACT

A multi-function interface includes a digital interface module, a configurable driver module, and a configurable output impedance module. The digital interface module is operably coupled to pass a $1^{st}$ type of input signal when the interface is in a $1^{st}$ mode and operably coupled to pass a $2^{nd}$ type of input signal when the interface is in a $2^{nd}$ mode. The configurable driver module is operably coupled to amplify the $1^{st}$ type of input signal when the interface is in the $1^{st}$ mode and to amplify the $2^{nd}$ type of input signal when the interface is in the $2^{nd}$ mode. The configurable output impedance module is coupled to the configurable driver module to provide a $1^{st}$ output impedance of the interface when the interface is in the $1^{st}$ mode and to provide a $2^{nd}$ output impedance when the interface is in the $2^{nd}$ mode.

30 Claims, 10 Drawing Sheets processing system 10 processing system 20 processing system 30 multiple processor device 40 data mapping for I/O modules 62, 64, 70, and/or 72

Tx I/O module 62 and/or 72

Tx I/O module 62 and/or 72

Tx I/O module 62 and/or 72

Tx I/O module 62 and/or 72

MULTI-FUNCTION INTERFACE AND APPLICATIONS THEREOF

This patent application is claiming priority under 35 USC § 119(e) to provisional patent application having the same title as the present application, a provisional Ser. No. of 60/419,044, and a provisional filing date of Oct. 16, 2002.

BACKGROUND OF THE INVENTION

1. Technical Field of the Invention

The present invention relates generally to data communications and more particularly to high-speed wired data communications.

2. Description of Related Art

As is known, communication technologies that link electronic devices are many and varied, servicing communications via both physical media and wirelessly. Some communication technologies interface a pair of devices, other communication technologies interface small groups of devices, and still other communication technologies interface large groups of devices.

Examples of communication technologies that couple small groups of devices include buses within digital computers, e.g., PCI (peripheral component interface) bus, ISA (industry standard architecture) bus, an USB (universal serial bus), SPI (system packet interface) among others. One relatively new communication technology for coupling relatively small groups of devices is the HyperTransport (HT) technology, previously known as the Lightning Data Transport (LDT) technology (HyperTransport I/O Link Specification "HT Standard"). The HT Standard sets forth definitions for a high-speed, low-latency protocol that can interface with today's buses like AGP, PCI, SPI, 1394, USB 2.0, and 1 Gbit Ethernet as well as next generation buses including AGP 8x, Infiniband, PCI-X, PCI 3.0, and 10 Gbit Ethernet. HT interconnects provide high-speed data links between coupled devices. Most HT enabled devices include at least a pair of HT ports so that HT enabled devices may be daisy-chained. In an HT chain or fabric, each coupled device may communicate with each other coupled device using appropriate addressing and control. Examples of devices that may be HT chained include packet data routers, server computers, data storage devices, and other computer peripheral devices, among others.

Of these devices that may be HT chained together, many require significant processing capability and significant memory capacity. Thus, these devices typically include multiple processors and have a large amount of memory. While a device or group of devices having a large amount of memory and significant processing resources may be capable of performing a large number of tasks, significant operational difficulties exist in coordinating the operation of multiple processors. While each processor may be capable of executing a large number operations in a given time period, the operation of the processors must be coordinated and memory must be managed to assure coherency of cached copies. In a typical multi-processor installation, each processor typically includes a Level 1 (L1) cache coupled to a group of processors via a processor bus. The processor bus is most likely contained upon a printed circuit board. A Level 2 (L2) cache and a memory controller (that also couples to memory) also typically couples to the processor bus. Thus, each of the processors has access to the shared L2 cache and the memory controller and can snoop the processor bus for its cache coherency purposes. This multi-processor installation (node) is generally accepted and functions well in many environments.

However, network switches and web servers often times require more processing and storage capacity than can be provided by a single small group of processors sharing a processor bus. Thus, in some installations, a plurality processor/memory groups (nodes) is sometimes contained in a single device. In these instances, the nodes may be rack mounted and may be coupled via a back plane of the rack. Unfortunately, while the sharing of memory by processors within a single node is a fairly straightforward task, the sharing of memory between nodes is a daunting task. Memory accesses between nodes are slow and severely degrade the performance of the installation. Many other shortcomings in the operation of multiple node systems also exist. These shortcomings relate to cache coherency operations, interrupt service operations, etc.

While HT links provide high-speed connectivity for the above-mentioned devices and in other applications, they are inherently inefficient in some ways. For example, in a "legal" HT chain, one HT enabled device serves as a host bridge while other HT enabled devices serve as dual link tunnels and a single HT enabled device sits at the end of the HT chain and serves as an end-of-chain device (also referred to as an HT "cave"). According to the HT Standard, all communications must flow through the host bridge, even if the communication is between two adjacent devices in the HT chain. Thus, if an end-of-chain HT device desires to communicate with an adjacent HT tunnel, its transmitted communications flow first upstream to the host bridge and then flow downstream from the host bridge to the adjacent destination device. Such communication routing, while allowing the HT chain to be well managed, reduces the overall throughput achievable by the HT chain.

Applications, including the above-mentioned devices, that otherwise benefit from the speed advantages of the HT chain are hampered by the inherent delays and transaction routing limitations of current HT chain operations. Because all transactions are serviced by the host bridge and the host a limited number of transactions it can process at a given time, transaction latency is a significant issue for devices on the HT chain, particularly so for those devices residing at the far end of the HT chain, i.e., at or near the end-of-chain device. Further, because all communications serviced by the HT chain, both upstream and downstream, must share the bandwidth provided by the HT chain, the HT chain may have insufficient total capacity to simultaneously service all required transactions at their required bandwidth(s). Moreover, a limited number of transactions may be addressed at any time by any one device such as the host, e.g., 32 transactions (2**5). The host bridge is therefore limited in the number of transactions that it may have outstanding at any time and the host bridge may be unable to service all required transactions satisfactorily. Each of these operational limitations affects the ability of an HT chain to service the communications requirements of coupled devices.

Further, even if an HT enabled device were incorporated into a system (e.g., an HT enabled server, router, etc. were incorporated into an circuit-switched system or packet-switched system), it would be required to interface with a legacy device that uses an older communication protocol. For example, if a line card were developed with HT ports, the line card would need to communicate with legacy line cards that include SPI ports.

Therefore, a need exists for methods and/or apparatuses for interfacing devices using one or more communication protocols in one or more configurations while overcoming the bandwidth limitations, latency limitations, and other limitations associated with the use of a high-speed HT chain.

BRIEF SUMMARY OF THE INVENTION

The multi-function interface of the present invention substantially meets these needs and others. The embodiment of the multi-function interface includes a digital interface module, a configurable driver module, and a configurable output impedance module. The digital interface module is operably coupled to pass a $1^{st}$ type of input signal (e.g., one formatted in accordance with HyperTransport protocol) when the interface is in a $1^{st}$ mode and operably coupled to pass a $2^{nd}$ type of input signal (e.g., one formatted in accordance with system packet interface protocol) when the interface is in a $2^{nd}$ mode. The configurable driver module is operably coupled to amplify the $1^{st}$ type of input signal when the interface is in the $1^{st}$ mode and to amplify the $2^{nd}$ type of input signal when the interface is in the 2nd mode. The configurable output impedance module is coupled to the configurable driver module to provide a $1^{st}$ output impedance of the interface when the interface is in the $1^{st}$ mode and to provide a $2^{nd}$ output impedance when the interface is in the 2nd mode. Accordingly, when the multi-function interface is incorporated in a multiprocessor device, the multiprocessor device may be configured in a plurality of ways using one or more communication protocols to overcome bandwidth limitations, latency limitations and other limitations associated with the use of high speed Hyper-Transport chains.

DETAILED DESCRIPTION OF THE INVENTION

Figure 1:
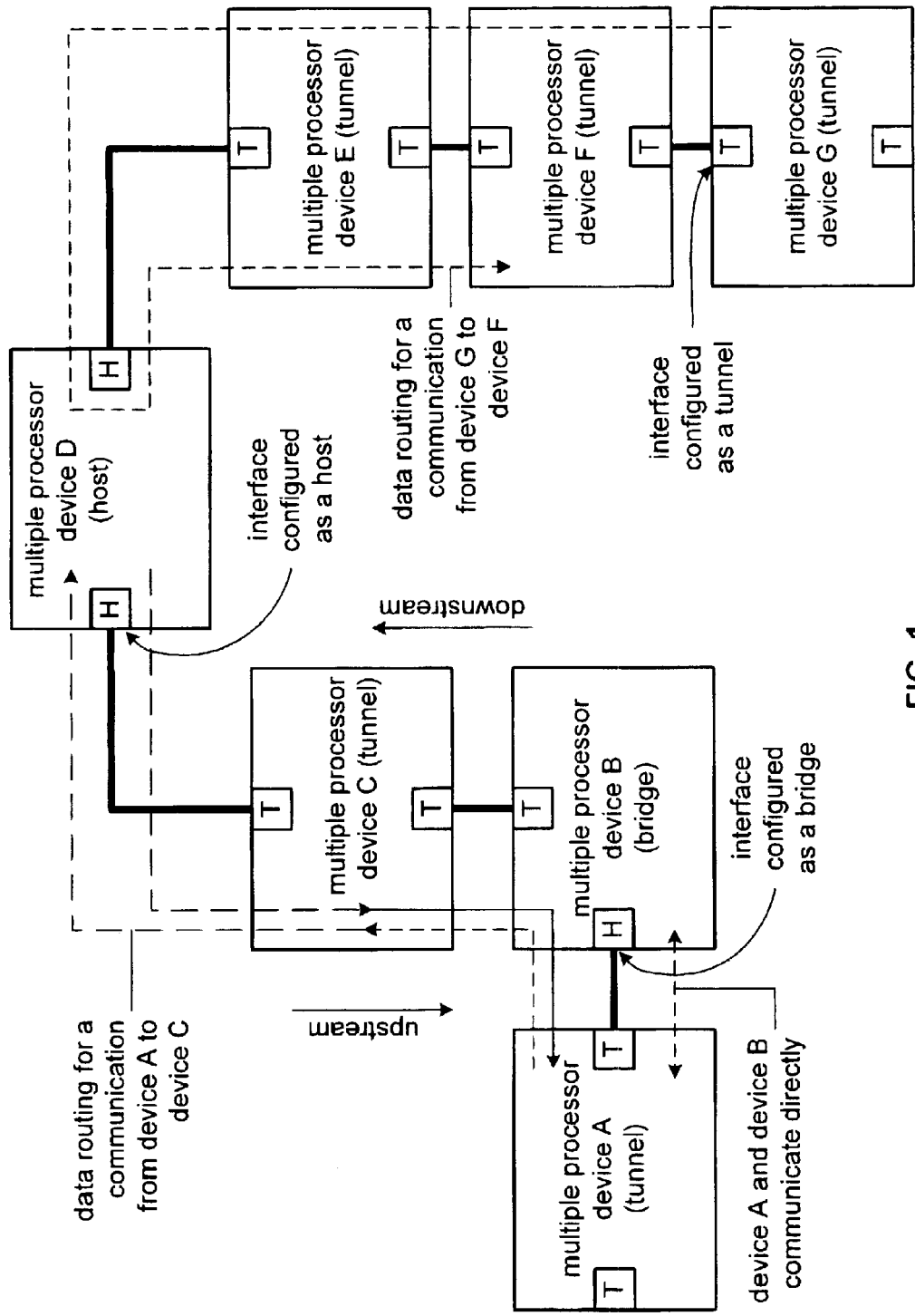
FIG. 1 is a schematic block diagram of a processing system in accordance with the present invention.

FIG. 1 is a schematic block diagram of a processing system 10 that includes a plurality of multiple processor devices A–G. Each of the multiple processor devices A–G include at least two interfaces, which in this illustration are labeled as T for tunnel functionality or H for host or bridge functionality. The details of the multiple processor devices A–G will be described in greater detail with reference to FIG. 4.

In this example of a processing system 10, multiple processor device D is functioning as a host to support two primary chains. The $1^{st}$ primary chain includes multiple processor device C, which is configured to provide a tunnel function, and multiple processor device B, which is configured to provide a bridge function. The other primary chain supported by device D includes multiple processor devices E, F, and G, which are each configured to provide tunneling functionality. The processing system 10 also includes a secondary chain that includes multiple processor devices A and B. where device A is configured to provide a tunneling function. Multiple processor device B functions as the host for the secondary chain. By convention, data from the devices (i.e., nodes) in a chain to the host device is referred to as downstream data and data from the host device to the node devices is referred to as upstream data.

In general, when a multiple processor device is providing a tunneling function, it passes, without interpretation, all packets received from downstream devices (i.e., the multiple processor devices that, in the chain, are further away from the host device) to the next upstream device (i.e., an adjacent multiple processor device that, in the chain, is closer to the host device). For example, multiple processor device E provides all downstream packets received from downstream multiple processor devices F and G to host device D without interpretation, even if the packets are addressing multiple processor device F or G. The host device modifies the downstream packets to identify itself as the source of downstream packets and sends the modified packets upstream along with any packets that it generated. As the multiple processor devices receive the upstream packets, they interpret the packet to identify the host device as the source and to identify a destination. If the multiple processor device is not the destination, it passes the upstream packets to the next downstream node. For example, packets received from the host device D that are directed to the multiple processor device E will be processed by the multiple processor device E, but device E will pass packets for devices F and G. The processing of packets by device E includes routing the packets to a particular processing unit within device E, routing to local memory, routing to external memory associated with device E, et cetera.

In this configuration, if multiple processor device G desires to send packets to multiple processor device F, the packets would traverse through devices E and F to host device D. Host device D modifies the packets identifying the multiple processor device D as the source of the packets and provide the modified packets to multiple processor device E, which would in turn forward them to multiple processor device F. A similar type of processing occurs between multiple processor device B and multiple processor device C, between devices G and E, and between devices E and F.

For the secondary chain, devices A and B can communication directly, i.e., they support peer-to-peer communications therebetween. In this instance, the multiple processor device B has one of its interfaces (H) configured to provide a bridge function. According, the bridge functioning interface of device B interprets packets it receives from device A to determine the destination of the packet. If the destination is local to device B (i.e., meaning the destination of the packet is one of the modules within multiple processor device B or associated with multiple processor device B), the H interface processes the received packet. The processing includes forwarding the packet to the appropriate destination within, or associated with, device B.

If the packet is not destined for a module within device B, multiple processor device B modifies the packet to identify itself as the source of the packets. The modified packets are then forwarded to the host device D via device C, which is providing a tunneling function. For example, if device A desires communication with device C, device A provides packets to device B and device B modifies the packets to identify device B as the source of the packets. Device B then provides the modified packets to host device D via device C. Host device D then, in turn, modifies the packets to identify itself as the sources of the packets and provides the again modified packets to device C, where the packets are subsequently processed. Conversely, if device C were to transmit packets to device A, the packets would first be sent to host D, modified by device D, and the modified packets would be provided back to device C. Device C, in accordance with the tunneling function, passes the packets to device B. Device B interprets the packets, identifies device A as the destination, and modifies the packets to identify device B as the source. Device B then provides the modified packets to device A for processing thereby.

In the processing system 10, device D, as the host, assigns a node ID (identification code) to each of the other multiple processor devices in the system. Multiple processor device D then maps the node ID to a unit ID for each device in the system, including its own node ID to its own unit ID. Accordingly, by including a bridging functionality in device B, in accordance with the present invention, the processing system 10 allows for interfacing between devices using one or more communication protocols and may be configured in one or more configurations while overcoming bandwidth limitations, latency limitations and other limitations associated with the use of high speed HyperTransport chains.

As one of average skill in the art will appreciate, the particular protocol for data transmission between devices may be in accordance with a HyperTransport protocol, system packet interface (SPI) protocol and/or other types of packet-switched or circuit-switched protocols.

Figure 2:
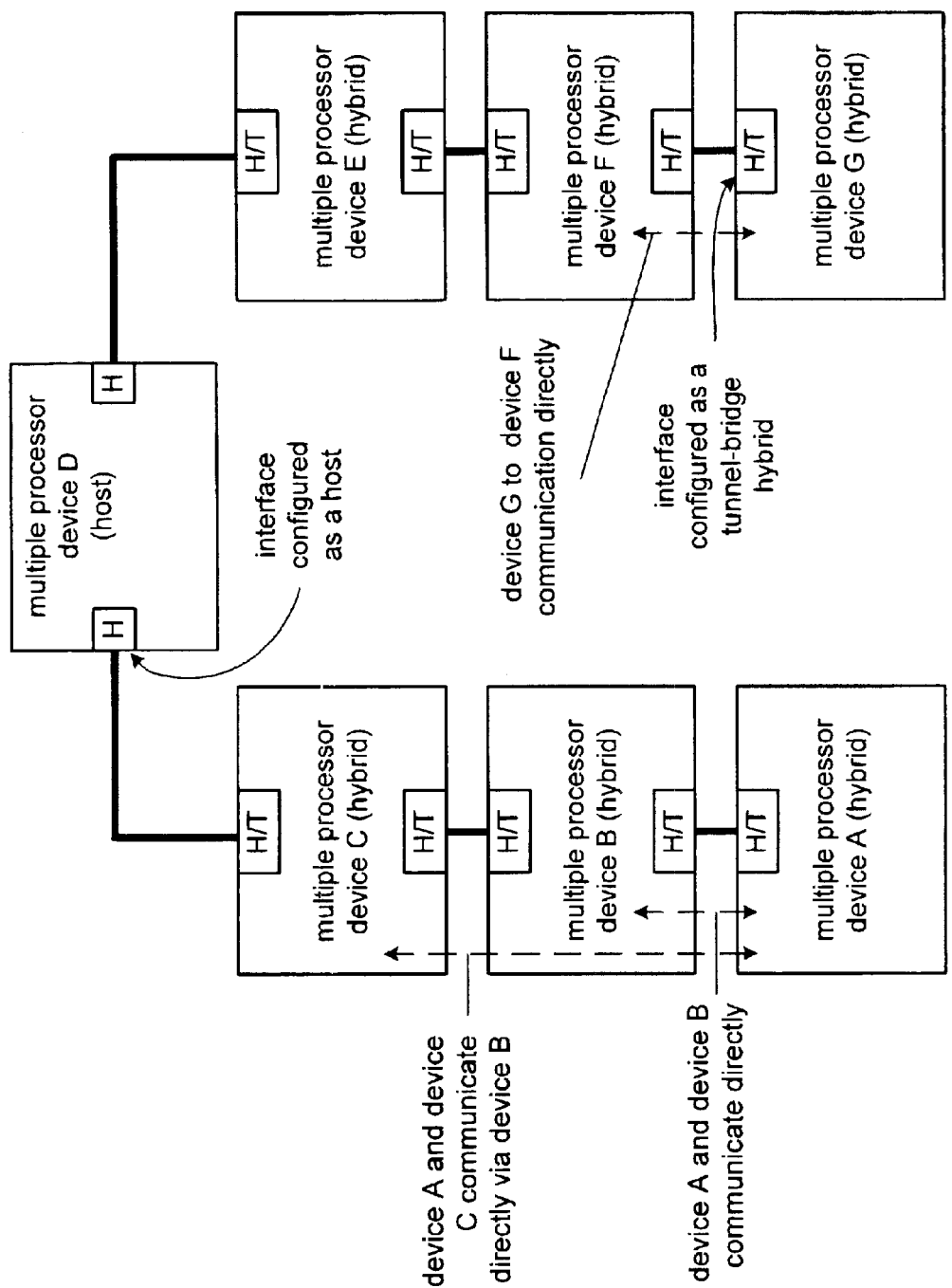
FIG. 2 is a schematic block diagram of an alternate processing system in accordance with the present invention.
Figure 4:
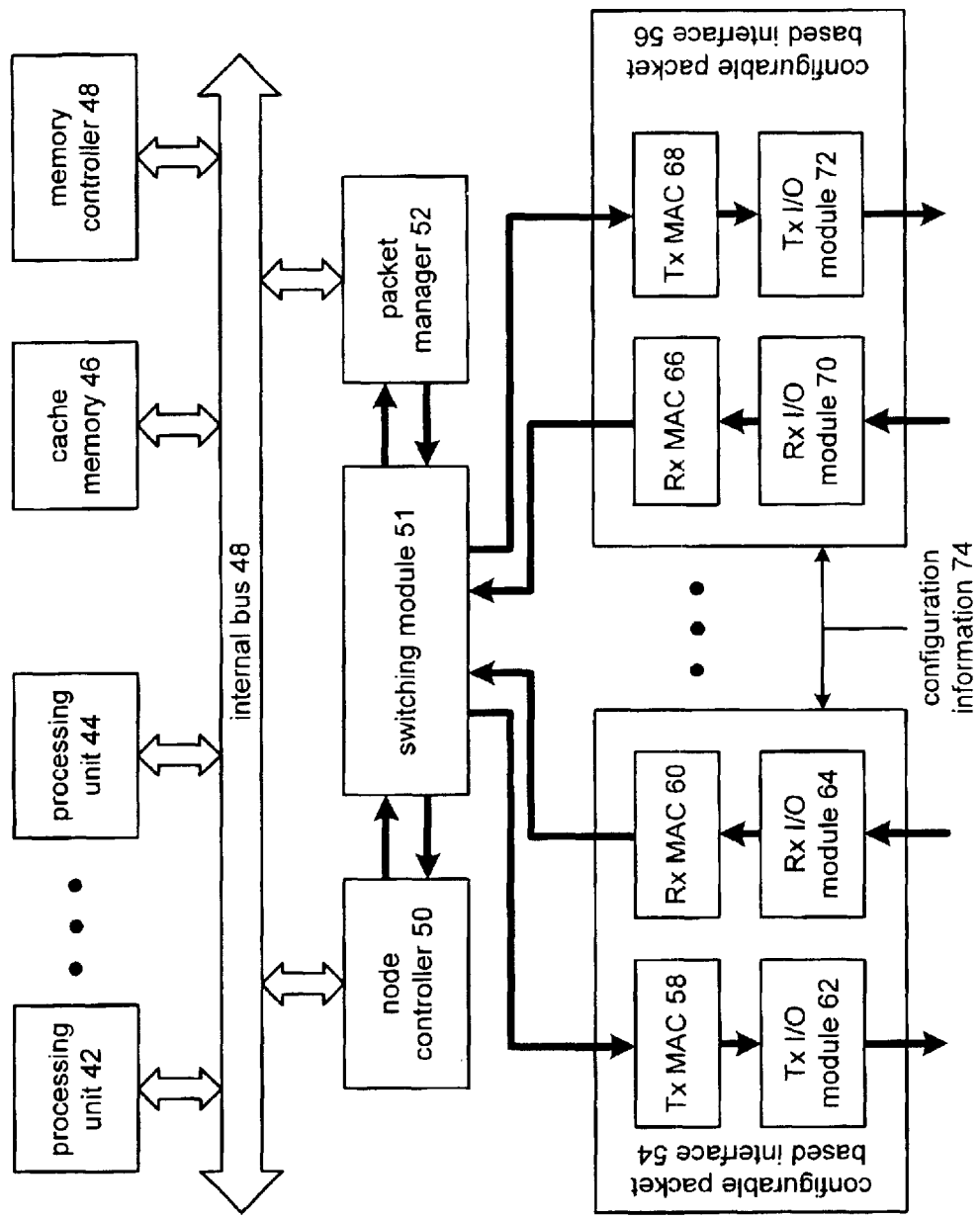
FIG. 4 is a schematic block diagram of a multiple processor device in accordance with the present invention.

FIG. 2 is a schematic block diagram of an alternate processing system 20 that includes a plurality of multiple processor devices A–G. In this system 20, multiple processor device D is the host device while the remaining devices are configured to support a tunnel-bridge hybrid interfacing functionality. Each of multiple processor devices A–C and E–G have their interfaces configured to support the tunnel-bridge hybrid (H/T) mode. With the interfacing configured in this manner, peer-to-peer communications may occur between multiple processor devices in a chain. For example, multiple processor device A may communicate directly with multiple processor device B and may communicate with multiple processor device C, via device B, without routing packets through the host device D. For peer-to-peer communication between devices A and B, multiple processor device B interprets the packets received from multiple processor device A to determine whether the destination of the packet is local to multiple processor device B. With reference to FIG. 4, a destination associated with multiple processor device B may be anyone of the processing units 42–44, cache memory 46 or system memory accessible through the memory controller 48. Returning back to the diagram of FIG. 2, if the packets received from device A are destined for a module within device B, device B processes the packets by forwarding them to the appropriate module within device B. If the packets are not destined for device B, device B forwards them, without modifying the source of the packets, to multiple processor device C.

The packets received by multiple processor device C are interpreted to determine whether a module within multiple processor device C is the destination of the packets. If so, device C processes them by forwarding the packets to the appropriate module within, or associated with, device C. If the packets are not destined for a module within device C, device C forwards them to the multiple processor device D. Device D modifies the packets to identify itself as the source of the packets and provides the modified packets to the chain including devices E–G. Devices E–G, in order, interpret the modified packets to determine whether it is a destination of the modified packets. If so, the device processes the packets. If not, the device routes the packets to the next device in chain. In addition, devices E–G support peer-to-peer communications in a similar manner as devices A–C. Accordingly, by configuring the interfaces of the devices to support a tunnel-bridge hybrid function, the source of the packets is not modified (except when the communications are between primary chains of the system), which enables the devices to use one or more communication protocols (e.g., HyperTransport, system packet interface, et cetera) in a peer-to-peer configuration that substantially overcomes the bandwidth limitations, latency limitations and other limitations associated with the use of a conventional high-speed HyperTransport chain.

Figure 3:
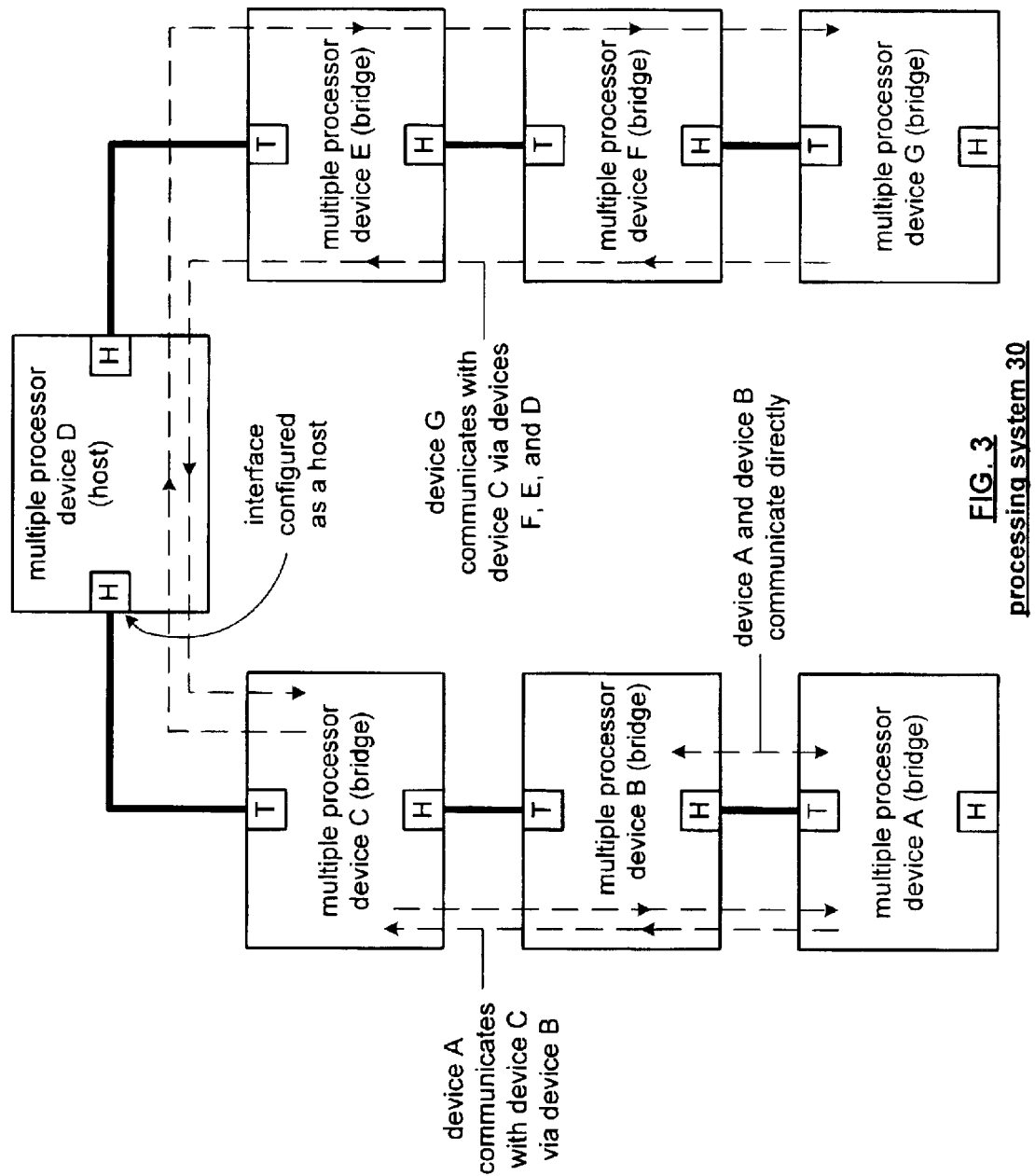
FIG. 3 is a schematic block diagram of another processing system in accordance with the present invention.

FIG. 3 is a schematic block diagram of processing system 30 that includes multiple processor devices A–G. In this embodiment, multiple processor device D is functioning as a host device for the system while the remaining multiple processor devices A–C and E–G are configured to support a bridge functionality. In this configuration, each of the devices may communicate directly (i.e., have peer-to-peer communication) with adjacent multiple processor devices via cascaded secondary chains. For example, device A may directly communicate with device B via a secondary chain therebetween, device B with device C via a secondary chain therebetween, device E with device F via a secondary chain therebetween, and device F with device G via a secondary chain therebetween. The primary chains in this example of a processing system exist between device D and device C and between device D and device E.

For communication between devices A and B, device B interprets packets received from device A to determine their destination. If device B is the destination, it processes it by providing it to the appropriate destination within, or associated with, device B. If the packet is not destined for device B, device B modifies the packet to identify device B as the source and forwards it to device C. Accordingly, if device A desires to communicate with device B, it does so via device B. However, for device A to communicate with device C, device B, as the host for the chain between devices A and B, modifies the packets to identify itself as the source of the packets. The modified packets are then routed to device C. To device C, the packets appear to be coming from device B and not device A. For packets from device C to device A, device B modifies the packets to identify itself as the source of the packets and provides the modified packets to device A. In such a configuration, each device only knows that it is communicating with one device in the downstream direct and one device in the upstream direction. As such, peer-to-peer communication is supported directly between adjacent devices and is also supported indirectly (i.e., by modifying the packets to identify the host of the secondary chain as the source of the packets) between any devices in the system.

In any of the processing systems illustrated in FIGS. 1–3, the devices on one chain may communicate with devices on the other chain. An example of this is illustrated in FIG. 3 where device G may communicate with device C. As shown, packets from device G are propagated through devices D, E and F until they reach device C. Similarly, packets from device C are propagated through devices D, E and F until they reach device G. In the example of FIG. 3, the packets in the downstream direction and in the upstream direction are adjusted to modify the source of the packets. Accordingly, packets received from device G appear, to device C, to be originated by device D. Similarly, packets from device C appear, to device G, to be sourced by device F. As one of average skill in the art will appreciate, each devices that is providing a host function or a bridge function maintains a table of communications for the chains it is the host to track the true source of the packets and the true destination of the packets.

FIG. 4 is a schematic block diagram of a multiple processor device 40 in accordance with the present invention. The multiple processor device 40 may be an integrated circuit or it may be comprised of discrete components. In either implementation, the multiple processor device 40 may be used as multiple processor device A–G in the processing systems illustrated in FIGS. 1–3.

The multiple processor device 40 includes a plurality of processing units 42–44, cache memory 46, memory controller 48, which interfaces with on and/or off-chip system memory, an internal bus 48, a node controller 50, a switching module 51, a packet manager 52, and a plurality of configurable packet based interfaces 54–56 (only two shown). The processing units 42–44, which may be two or more in numbers, may have a MIPS based architecture, to support floating point processing and branch prediction. In addition, each processing unit 42, 44 may include a memory sub-system of an instruction cache and a data cache and may support separately, or in combination, one or more processing functions. With respect to the processing system of FIGS. 1–3, each processing unit 42 or 44 may be a destination within multiple processor device 40 and/or each processing function executed by the processing modules 42–44 may be a destination within the processor device 40.

The internal bus 48, which may be a 256 bit cache line wide split transaction cache coherent orientated bus, couples the processing units 42–44, cache memory 46, memory controller 48, node controller 50 and packet manager 52 together. The cache memory 46 may function as an L2 cache for the processing units 42–44, node controller 50 and/or packet manager 52. With respect to the processing system of FIGS. 1–3, the cache memory 46 may be a destination within multiple processor device 40.

The memory controller 48 provides an interface to system memory, which, when the multiple processor device 40 is an integrated circuit, may be off-chip and/or on-chip. With respect to the processing system of FIGS. 1–3, the system memory may be a destination within the multiple processor device 40 and/or memory locations within the system memory may be individual destinations within the device 40. Accordingly, the system memory may include one or more destinations for the processing systems illustrated in FIGS. 1–3.

The node controller 50 functions as a bridge between the internal bus 48 and the configurable packet-based interfaces 54–56. Accordingly, accesses originated on either side of the node controller will be translated and sent on to the other. The node controller also supports the distributed shared memory model associated with the cache coherency non-uniform memory access (CC-NUMA) protocol.

The switching module 51 couples the plurality of configurable packet-based interfaces 54–56 to the node controller 50 and/or to the packet manager 52. The switching module 51 functions to direct data traffic, which may be in a generic format, between the node controller 50 and the configurable packet-based interfaces 54–56 and between the packet manager 52 and the configurable packet-based interfaces 54. The generic format may include 8 byte data words or 16 byte data words formatted in accordance with a proprietary protocol, in accordance with asynchronous transfer mode (ATM) cells, in accordance internet protocol (IP) packets, in accordance with transmission control protocol/internet protocol (TCP/IP) packets, and/or in general, in accordance with any packet-switched protocol or circuit-switched protocol.

The packet manager 52 may be a direct memory access (DMA) engine that writes packets received from the switching module 51 into input queues of the system memory and reads packets from output queues of the system memory to the appropriate configurable packet-based interface 54–56. The packet manager 52 may include an input packet manager and an output packet manager each having its own DMA engine and associated cache memory. The cache memory may be arranged as first in first out (FIFO) buffers that respectively support the input queues and output queues.

The configurable packet-based interfaces 54–56 generally function to convert data from a high-speed communication protocol (e.g., HT, SPI, etc.) utilized between multiple processor devices 40 and the generic format of data within the multiple processor devices 40. Accordingly, the configurable packet-based interface 54 or 56 may convert received HT or SPI packets into the generic format packets or data words for processing within the multiple processor device 40. In addition, the configurable packet-based interfaces 54 and/or 56 may convert the generic formatted data received from the switching module 51 into HT packets or SPI packets. The particular conversion of packets to generic formatted data performed by the configurable packet-based interfaces 54 and 56 is based on configuration information 74, which, for example, indicates configuration for HT to generic format conversion or SPI to generic format conversion.

Each of the configurable packet-based interfaces 54–56 includes a media access controller (MAC) 58 or 68, a receiver MAC 60 or 66, a transmitter input/output module 62 or 72, and a receiver input/output module 64 or 70. In general, the transmit MAC module 58 or 68 functions to convert outbound data of a plurality of virtual channels in the generic format to a stream of data in the specific high-speed communication protocol (e.g., HT, SPI, etc.) format. The transmit I/O module 62 or 72 generally functions to drive the high-speed formatted stream of data onto the physical link coupling the present multiple processor device 40 to another multiple processor device. The transmit I/O module 62 or 72 is further described with reference to FIGS. 6–10. The receive MAC module 60 or 66 generally functions to convert the received stream of data from the specific high-speed communication protocol (e.g., HT, SPI, etc.) format into data from a plurality of virtual channels having the generic format. The receive I/O module 64 or 70 generally functions to amplify and time align the high-speed formatted steam of data received via the physical link coupling the present multiple processor device 40 to another multiple processor device. The receive I/O module 64 or 70 is further described, and incorporated herein by reference, in co-pending patent application entitled RECEIVER MULTI-PROTOCOL INTERFACE AND APPLICATIONS THEREOF, having an attorney docket number of BP 2389.1, and having the same filing date and priority date as the present application.

The transmit and/or receive MACs 58, 60, 66 and/or 68 may include, individually or in combination, a processing module and associated memory to perform its correspond functions. The processing module may be a single processing device or a plurality of processing devices. Such a processing device may be a microprocessor, microcontroller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory may be a single memory device or a plurality of memory devices. Such a memory device may be a read-only memory, random access memory, volatile memory, non-volatile memory, static memory, dynamic memory, flash memory, and/or any device that stores digital information. Note that when the processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory stores, and the processing module executes, operational instructions corresponding to the functionality performed by the transmitter MAC 58 or 68 as disclosed, and incorporated herein by reference, in co-pending patent application entitled TRANSMITTING DATA FROM A PLURALITY OF VIRTUAL CHANNELS VIA A MULTIPLE PROCESSOR DEVICE, having an attorney docket number of BP 2184.1 and having the same filing date and priority date as the present patent application and corresponding to the functionality performed by the receiver MAC module 60 or 66 as disclosed, and incorporated herein by reference, in co-pending patent application entitled PROCESSING OF RECEIVED DATA WITHIN A MULTIPLE PROCESSOR DEVICE, having an attorney docket number of BP 2184, and having the same filing date and priority date as the present patent application.

In operation, the configurable packet-based interfaces 54–56 provide the means for communicating with other multiple processor devices 40 in a processing system such as the ones illustrated in FIGS. 1, 2 or 3. The communication between multiple processor devices 40 via the configurable packet-based interfaces 54 and 56 is formatted in accordance with a particular high-speed communication protocol (e.g., HyperTransport (HT) or system packet interface (SPI)). The configurable packet-based interfaces 54–56 may be configured to support, at a given time, one or more of the particular high-speed communication protocols. In addition, the configurable packet-based interfaces 54–56 may be configured to support the multiple processor device 40 in providing a tunnel function, a bridge function, or a tunnel-bridge hybrid function.

When the multiple processor device 40 is configured to function as a tunnel-hybrid node, the configurable packet-based interface 54 or 56 receives the high-speed communication protocol formatted stream of data and separates, via the MAC module 60 or 68, the stream of incoming data into generic formatted data associated with one or more of a plurality a particular virtual channels. The particular virtual channel may be associated with a local module of the multiple processor device 40 (e.g., one or more of the processing units 42–44, the cache memory 46 and/or memory controller 48) and, accordingly, corresponds to a destination of the multiple processor device 40 or the particular virtual channel may be for forwarding packets to the another multiple processor device.

The interface 54 or 56 provides the generically formatted data words, which may comprise a packet or portion thereof, to the switching module 51, which routes the generically formatted data words to the packet manager 52 and/or to node controller 50. The node controller 50, the packet manager 52 and/or one or more processing units 42–44 interprets the generically formatted data words to determine a destination therefor. If the destination is local to multiple processor device 40 (i.e., the data is for one of processing units 42–44, cache memory 46 or memory controller 48), the node controller 50 and/or packet manager 52 provides the data, in a packet format, to the appropriate destination. If the data is not addressing a local destination, the packet manager 52, node controller 50 and/or processing unit 42–44 causes the switching module 51 to provide the packet to one of the other configurable packet-based interfaces 54 or 56 for forwarding to another multiple processor device in the processing system. For example, if the data were received via configuration packet-based interface 54, the switching module 51 would provide the outgoing data to configurable packet-based interface 56. In addition, the switching module 51 provides outgoing packets generated by the local modules of processing module device 40 to one or more of the configurable packet-based interfaces 54–56.

The configurable packet-based interface 54 or 56 receives the generic formatted data via the transmitter MAC module 58 or 68. The transmitter MAC module 58, or 68 converts the generic formatted data from a plurality of virtual channels into a single stream of data. The transmitter input/output module 62 or 72 drives the stream of data on to the physical link coupling the present multiple processor device to another.

When the multiple processor device 40 is configured to function as a tunnel node, the data received by the configurable packet-based interfaces 54 from a downstream node is routed to the switching module 51 and then subsequently routed to another one of the configurable packet-based interfaces for transmission downstream without interpretation. For upstream transmissions, the data is interpreted to determine whether the destination of the data is local. If not, the data is routed upstream via one of the configurable packet-based interfaces 54 or 56.

When the multiple processor device 40 is configured as a bridge node, downstream packets that are received via a configurable packet-based interface 54 are modified via the packet manager 52, the node controller 54 and/or processing units 42–44 to identify the current multiple processor device 40 as the source of the data. Having modified the source, the switching module 51 provides the modified data to one of the configurable packet-based interfaces for transmission downstream. For upstream transmissions, the multiple processor device 40 interprets the data to determine whether it contains the destination for the data. If so, the data is routed to the appropriate destination. If not, the multiple processor device 40 forwards the packet via one of the configurable packet-based interfaces 54 or 56 to a downstream device.

To determine the destination of the data, the node controller 50, the packet manager 52 and/or one of the processing units 42 or 44 interprets header information of the data to identify the destination. In addition, a set of ordering rules of the received data is applied when processing the data, where processing includes forwarding the data, in packets, to the appropriate local destination or forwarding it onto another device. The ordering rules include the ordering rules as defined in the HT specification as well as non-posted commands are issued in order of reception. The rules further include that the interfaces are aware of whether they are configured to support a tunnel, bridge, or tunnel-bridge hybrid node. With such awareness, for every ordered pair of transactions, the receiver portion of the interface will not make a new ordered pair visible to the switching module until the old ordered pair has been sent to the switching module. The node controller, in addition to adhering to the HT specified ordering rules, treats all HT transactions as being part of the same input/output stream, regardless of which interface the transactions was received from. Accordingly, by applying the appropriate ordering rules, the routing to and from the appropriate destinations either locally or remotely is accurately achieved.

Figure 5:
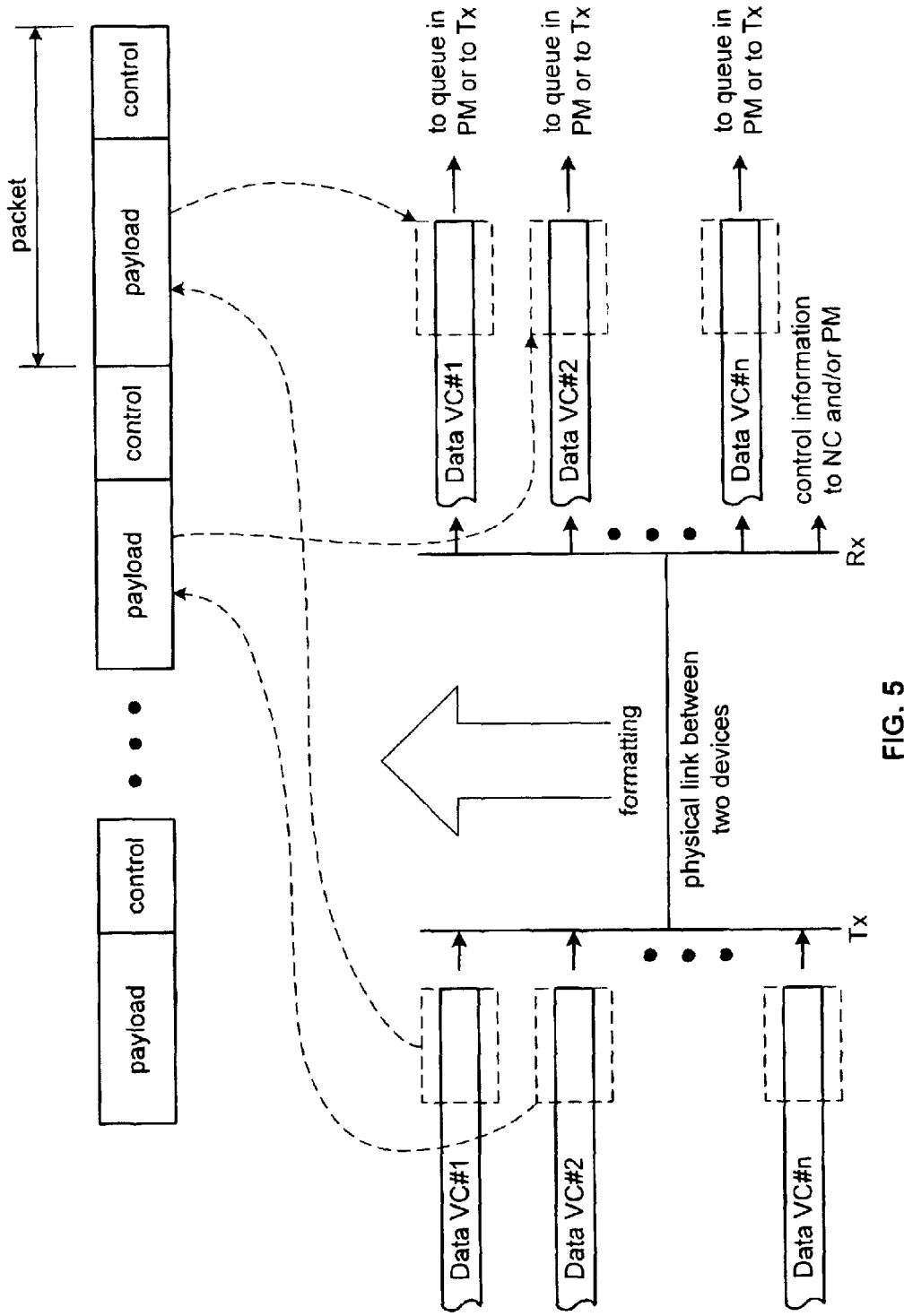
FIG. 5 is a graphical representation of transporting data between devices in accordance with the present invention.

FIG. 5 is a graphical representation of the functionality performed by a combination of the node controller 50, the switching module 51, the packet manager 52 and/or the configurable packet-based interfaces 54 and 56. In this illustration, data is transmitted over a physical link between two devices in accordance with a particular high-speed communication protocol (e.g., HT, SPI-4, etc.). Accordingly, the physical link supports a protocol that includes a plurality of packets. Each packet includes a data payload and a control section. The control section may include header information regarding the payload, control data for processing the corresponding payload, and/or control data for system administration functions.

Within a multiple processor device, a plurality of virtual channels may be established. A virtual channel may correspond to a particular physical entity, such as processing units 42, 44, cache memory 46 and/or memory controller 48, and/or to a logical entity such as a particular algorithm being executed by processing module 42 or 44, particular memory locations within cache memory 46 and/or particular memory locations within system memory accessible via the memory controller 48. In addition, one or more virtual channels may correspond to data packets received from downstream or upstream nodes that require forwarding. Accordingly, each multiple processor device supports a plurality of virtual channels. The data of the virtual channels, which is illustrated as data virtual channel number 1 (VC#1), virtual channel number 2 (VC#2) through virtual channel number N (VC#n) may have a generic format. The generic format may be 8 byte data words, 16 byte data words that correspond to a proprietary protocol, ATM cells, IP packets, TCP/IP packets, other packet switched protocols and/or circuit switched protocols.

As illustrated, a plurality of virtual channels is sharing the physical link between the two devices. The multiple processor device 40, via one of the processing units 42–44, node controller 50 and/or packet manager 52 manages the allocation of the physical link among the plurality of virtual channels. As shown, the payload of a particular packet may be loaded with a segment of a virtual channel. In this illustration, the $1^{st}$ packet includes a segment, or fragment, of virtual channel number 1. The data payload of the next packet receives a segment, or fragment, of virtual channel number 2. The allocation of virtual channels to packets may be done in a round-robin fashion, a weighted round-robin fashion or some other application of fairness to access the physical link. The data transmitted across the physical link may be in a serial format and at extremely high data rates (e.g., 3.125 gigabits-per-second or greater).

At the receiving device, the serial stream of data is received and then separated into the corresponding virtual channels via the configurable packet-based interface, the switching module 51, the node controller 50 and/or packet manager 52. The recaptured virtual channel data is either provided to an input queue for a local destination or provided to an output queue for forwarding via one of the configurable packet-based interfaces to another device. Accordingly, each of the devices in a processing system as illustrated in FIGS. 1–3 may utilize a high speed serial interface, or plurality of high speed serial interfaces, to transceive data from a plurality of virtual channels utilizing one or more communication protocols and be configured in one or more configurations while substantially overcoming the bandwidth limitations, latency limitations and other limitations associated with the use of a high speed Hyper-Transport chain. Configuring the multiple processor devices for application in the multiple configurations of processing systems is described in greater detail and incorporated herein by reference in co-pending patent application entitled MULTIPLE PROCESSOR INTEGRATED CIRCUIT HAVING CONFIGURABLE PACKET-BASED INTERFACES, having an attorney docket number of BP 2186, and having the same filing date and priority date as the present patent application.

Figure 6:
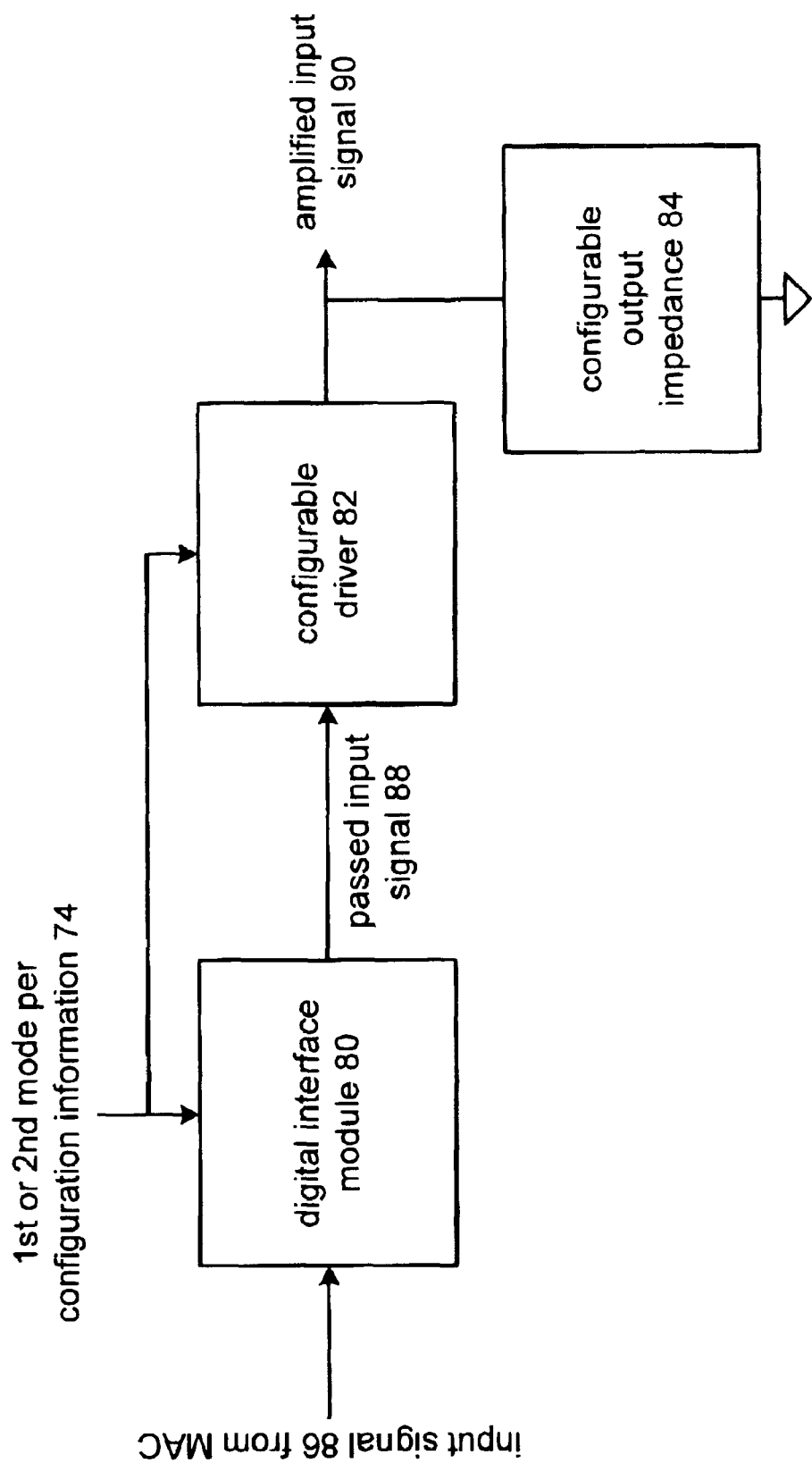
FIG. 6 is a schematic block diagram of a multi-function interface that may be used as a transmitter input/output module in accordance with the present invention.

FIG. 6 is a schematic block diagram of a multi-function interface that may be used as the transmit IO module 62 and/or 72 of the multiprocessor device 40. The interface includes a digital interface module 80, a configurable driver 82 and a configurable output impedance 84. The digital interface module 80 is operably coupled to receive an input signal 86 from an associated transmitter MAC module 58 or 68. The digital interface module 80 will allow a $1^{st}$ type of input signal 86 to pass when the configuration information 74 indicates a $1^{st}$ mode of operation to produce a passed input signal 88. The digital interface module 80 will pass a $2^{nd}$ type of input signal 86 when the configuration information indicates a $2^{nd}$ mode of operation. For example, the $1^{st}$ mode of operation may be in accordance with a system packet interface (SPI) protocol and the $2^{nd}$ mode may be in accordance with a HyperTransport (HT) protocol. In general, the digital interface module 80 determines a digital value of a control signal, which may be included in configuration information 74. When the control signal has a $1^{st}$ digital value (e.g., corresponding to the $1^{st}$ mode of operation), the digital interface module 80 will pass a $1^{st}$ type of input signal. Conversely, when the control signal has a $2^{nd}$ digital value (e.g., corresponding to the $2^{nd}$ mode of operation), the digital interface module 80 passes a $2^{nd}$ type of input signal.

The configurable driver 82 receives the passed input signal 88 and amplifies it in accordance with the $1^{st}$ or $2^{nd}$ mode of operation to produce an amplified input signal 90. The amplified input signal 90 will be driven on the physical link coupling the present multiprocessor device to another. In general, the configurable driver, when in the $1^{st}$ mode, may be configured as a current steering driver to produce the amplified input signal 90 from the passed input signal 88 and having a specific output impedance based on the corresponding configuration of the configurable output impedance 84. Alternatively, the configurable driver 82 may be configured as a Class A or Class AB amplifier having a second specific output impedance based on the corresponding configuration of the configurable output impedance 84 when the interface is in the $2^{nd}$ mode of operation to produce the amplified input signal 90.

Figure 7:
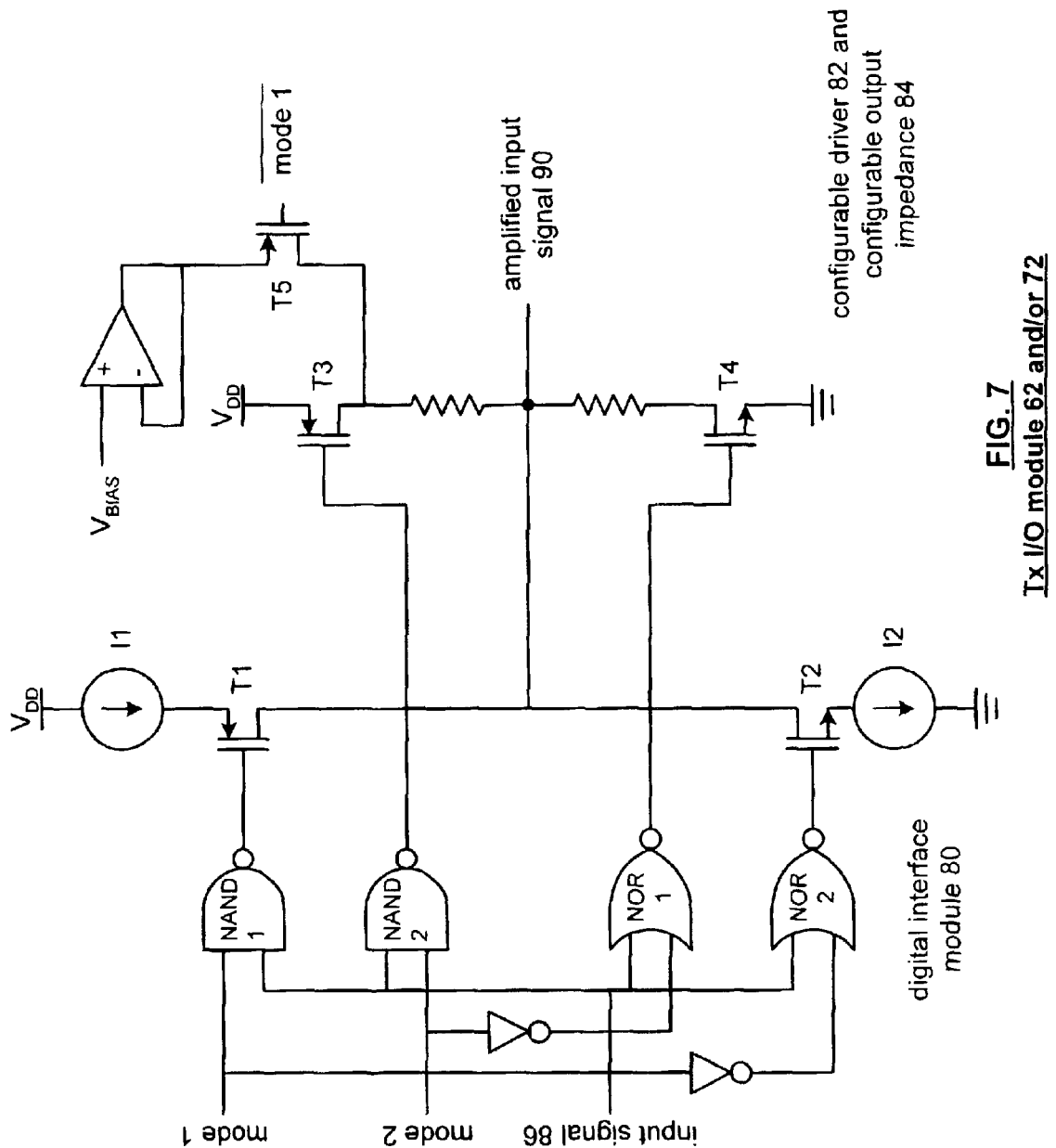
FIG. 7 is a schematic block diagram of an alternate multi-function interface that may be used as a transmitter input/output module in accordance with the present invention.

FIG. 7 is a schematic block diagram of a single-ended embodiment of the transmit input/output modules 62 and/or 72 in accordance with the present invention. In this embodiment, the interface module includes the digital interface module 80, the configurable driver 82 and the configurable output impedance 84. The digital interface module 80 includes a pair of NAND gates, a pair of NOR gates, and a pair of inverters. The configurable output impedance 84 includes an impedance ladder that has a $1^{st}$ end, a $2^{nd}$ end and a tap. In this example, the impedance ladder includes two resistors coupled in series, but may be any passive or active component combination to provide a desired output impedance for a given frequency range of operation. The remaining components correspond to the configurable driver 82. To activate the $1^{st}$ or $2^{nd}$ mode, the desired mode would be selected via a logic 1 signal. As one of average skill in the art will appreciate, the configuration of the digital interface module 80 may be configured to activate the particular mode on a logic low signal. When the $1^{st}$ mode is activated, (e.g., by a logic 1 signal) the $2^{nd}$ mode will be deactivated via a logic low signal. The corresponding digital logic circuitry for the $1^{st}$ mode includes NAND gate 1, NOR gate 2 and an inverter, which, in the first mode, allow the input signal 86 to pass to transistors T1 and T2 of the configurable driver. The digital logic circuitry for the $2^{nd}$ mode of operation, NAND gate 2, NOR gate 1 and an inverter are held inactive such that the input signal 86 is not passed to transistors T3 and T4 of the configurable driver.

With the mode 1 input high, the output of NAND gate corresponds to the inverse of input signal 86. Similarly, the output of NOR gate 2 corresponds to the inverse of input signal 86. As such, when mode 1 is activated, the amplified input signal 90 is produced via the switching of transistors T1 and T2 and sourced by current sources I1 and I2. The output impedance 84 is biased via a bias voltage coupled via transistor T5. Accordingly, in this mode, the I/O module 62 and/or 72 is providing a current steering function to produce the amplified input signal 90.

When mode 2 is enabled, (e.g., via a logic 1 signal) and mode 1 is disabled (e.g., via a logic 0 signal), transistors T1, T2 and T5 are off. Conversely, the digital interface module 80 passes the input signal to transistors T3 and T4. Transistors T3 and T4 in combination with the impedance ladder provides the amplified input signal 90 from the input signal 86.

Figure 8:
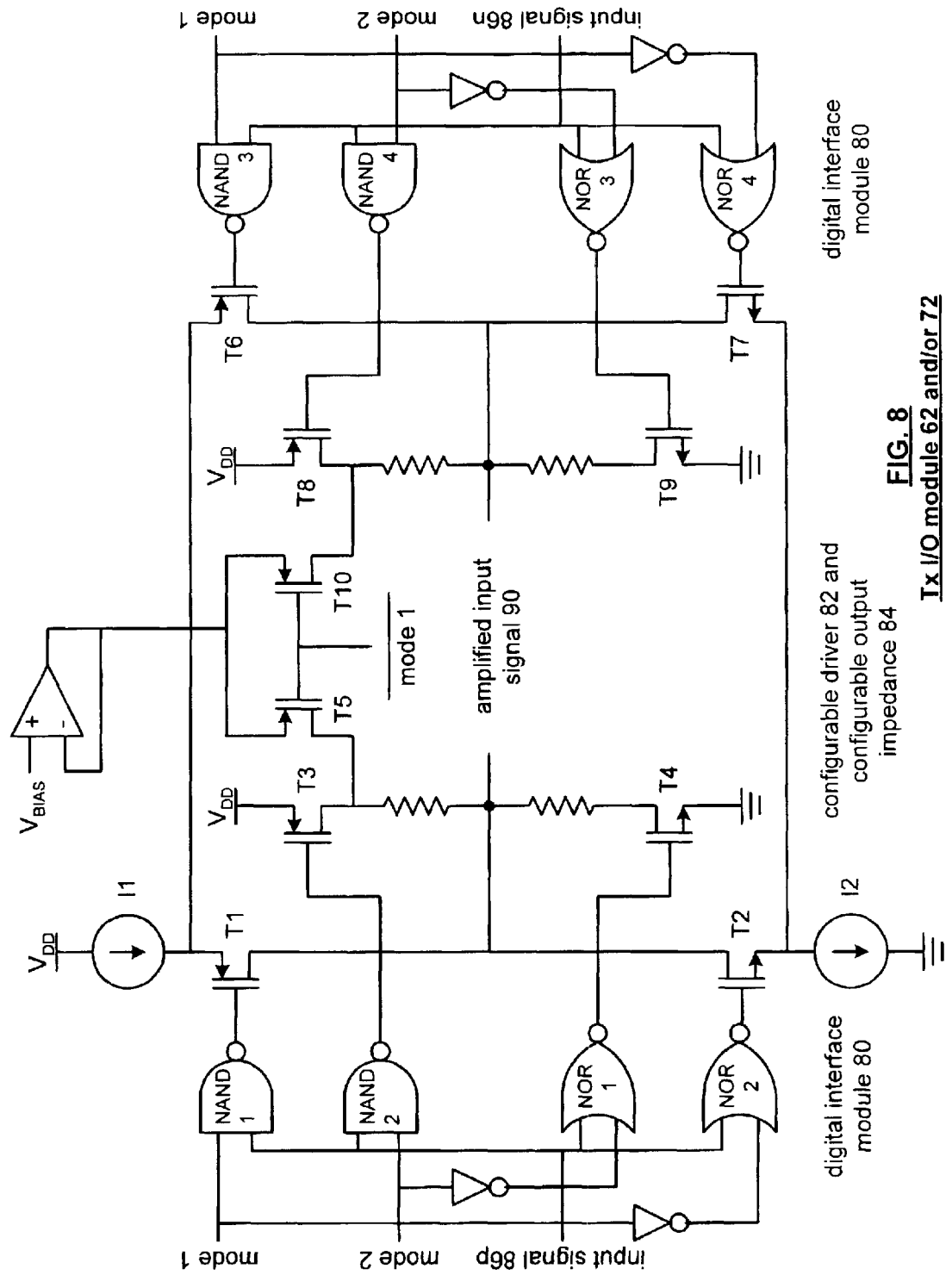
FIG. 8 is a schematic block diagram of a differential multi-function interface that may be used as a transmit input/output module in accordance with the present invention.

FIG. 8 is a schematic block diagram of a differential signaling embodiment of the transmitter input/output modules 62 and/or 72. In this embodiment, the digital interface module 82 includes a plurality of logic circuits that comprise NAND gates, NOR gates and inverters. The configurable output impedance 84 includes two resistive ladders and the remaining components comprise the configurable driver 82. The operation of this embodiment will be described with reference to FIGS. 9 and 10.

Figure 9:
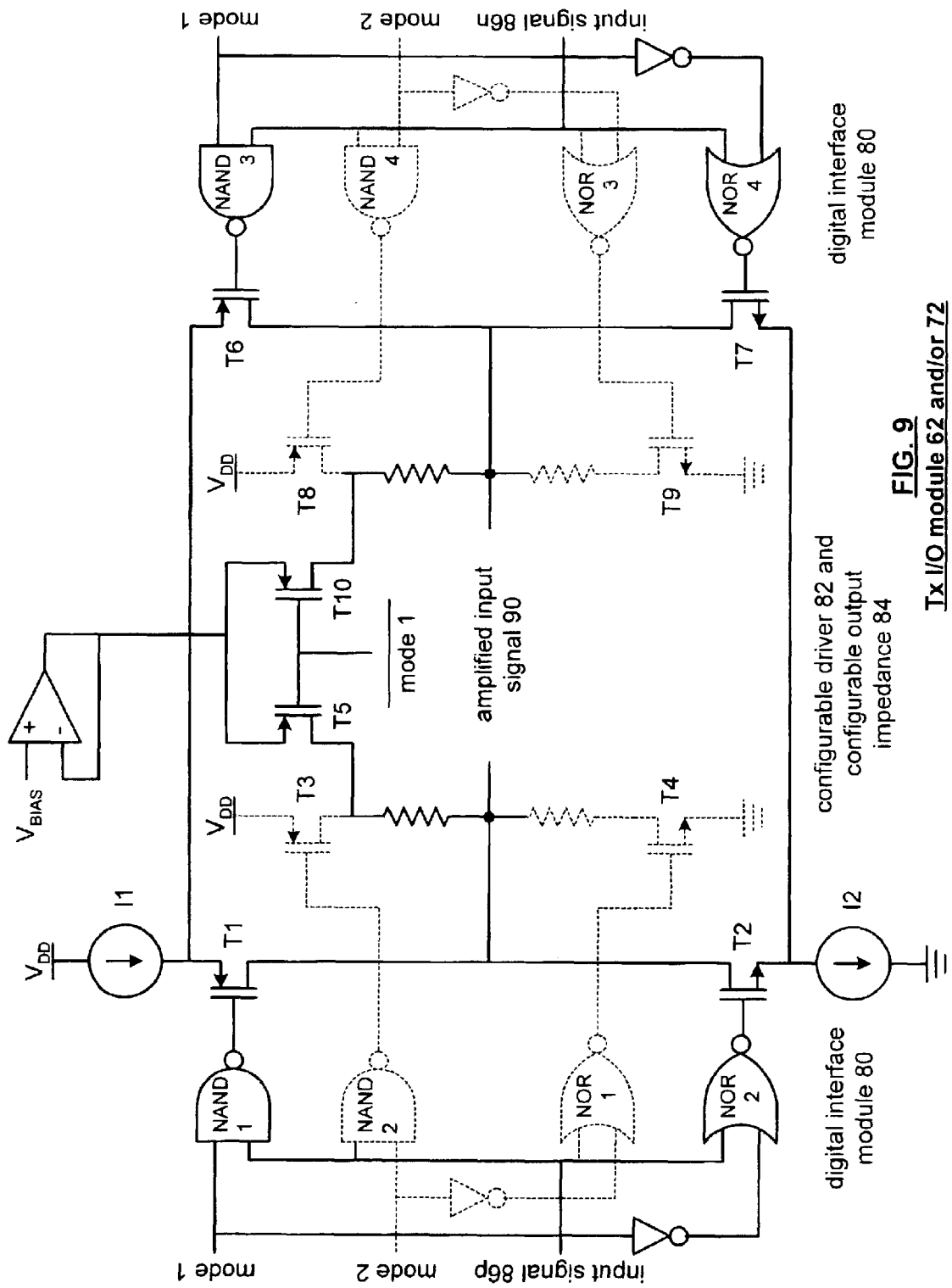
FIG. 9 is a schematic block diagram of the interface module of FIG. 8 functioning in accordance with a $1^{st}$ mode of operation in accordance with the present invention.

FIG. 9 illustrates the transmitter input/output module 82 and/or 72 of FIG. 8 configured in the $1^{st}$ mode (e.g., SPI mode). In this embodiment, the resisters of the configurable output impedance may each be 50 Ohm resisters and the current sources I1 and I2 may be 6 milliamps. $V_{DD}$ may be a 2.5 volt source while the bias is a 1.2 volt source. As shown in FIG. 9, the dashed line components are inactive during this mode and the solid line components are active. Accordingly the solid line components provide a current steering amplifier that is produced by switching transistors T1 and T7 on alternatively, per the input signal 86, with enabling transistors T2 and T6 to steer the currents produced by the current sources I1 and I2 through the output impedance ladders to produce a differential amplified signal 90. The output impedance ladder is biased via the bias voltage, which is coupled to the output impedance via transistors T5 and T10.

Figure 10:
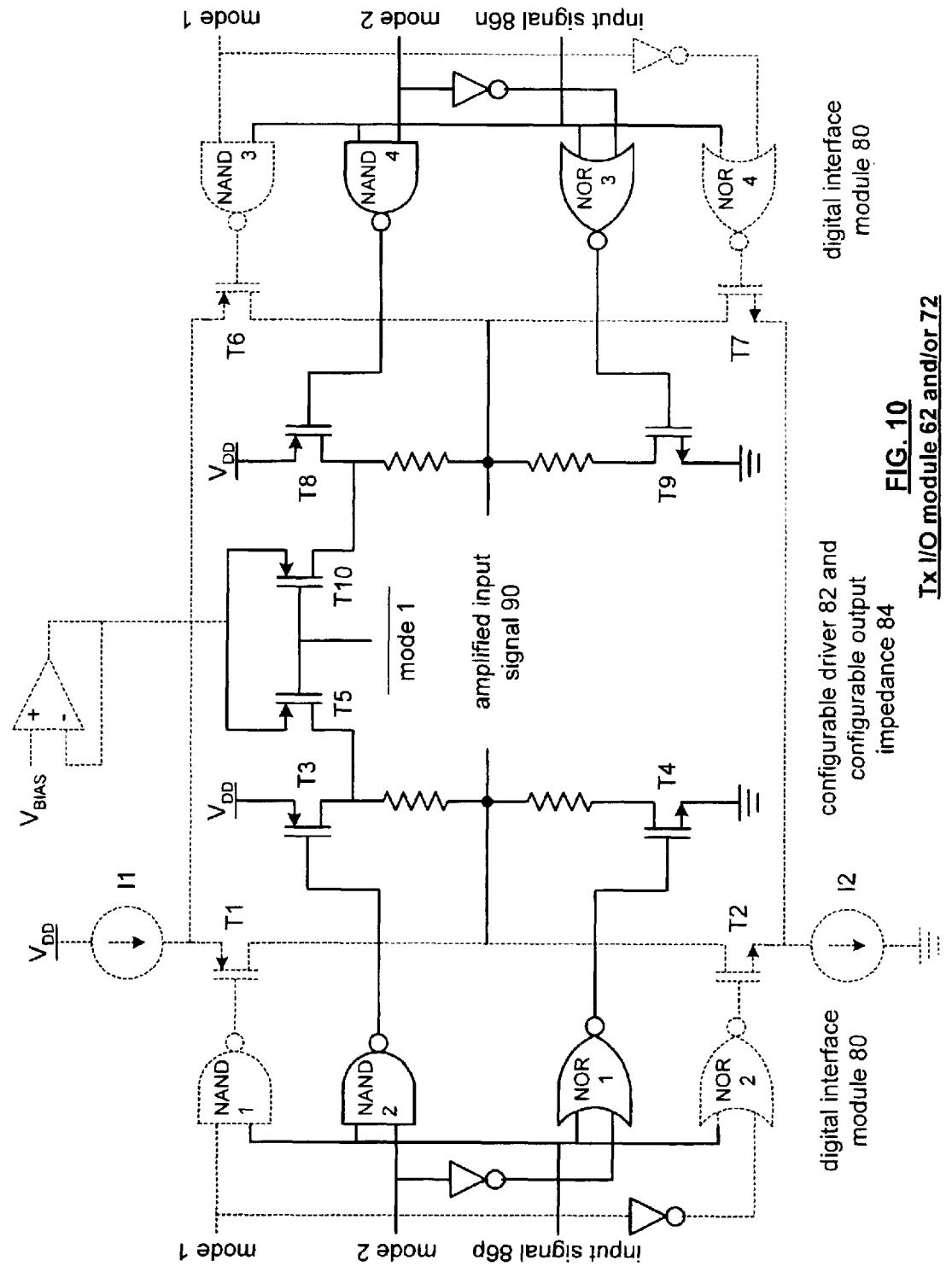
FIG. 10 is a schematic block diagram of the multi-function interface of FIG. 8 configured in accordance with a $2^{nd}$ mode of operation in accordance with the present invention.

FIG. 10 is a schematic block diagram of the 10 module 62 and/or 72 in the $2^{nd}$ mode of operation (e.g., HyperTransport mode). In this example, dashed lines illustrate the inactive components and the enable components are illustrated by the solid line components. In operation, the alternating enabling, per the input signal 86, of transistors T3, T4, T8 and T9 provide a Class A or Class AB amplifier. The four resisters of the configurable output impedance provide the output impedance.

By utilizing one of the various embodiments of a multi-function interface as a transmit input/output module within a multiple processor device, the multiprocessor device may be configured within a processing system utilizing one or more communication protocols. In addition, the multi-function interface allows the multiprocessor device to be configured in a variety of ways. As one of average skill in the art will appreciate, other embodiments may be derived from the teaching of the present invention, without deviating from the scope of the claims.

What is claimed is:

1. A multi-function interface comprising:

digital interface module operably coupled to pass a first type of input signal when the multi-function interface is in a first mode and operably coupled to pass a second type of input signal when the multi-function interface is in a second mode;

configurable driver module operably coupled to amplify the first type of input signal when the multi-function interface is in the first mode and to amplify the second type of input signal when the multi-function interface is in the second mode; and configurable output impedance module operably coupled to the configurable driver module to provide a first output impedance when the multi-function interface is in the first mode and to provide a second output impedance when the multi-function interface is in the second mode.

2. The multi-function interface of claim 1, wherein the digital interface module further comprises:

first digital logic circuitry operable to provide the first type of input signal to the configurable driver when a control signal is of a first digital value; and second digital logic circuitry operable to provide the second type of input signal to the configurable driver when the control signal is of a second digital value.

3. The multi-function interface of claim 1, wherein the configurable output impedance module further comprises:

impedance ladder having a first end, a second end, and a tap, wherein the tap provides an output of the multi-function interface.

4. The multi-function interface of claim 3, wherein the configurable driver module further comprises:

first transistor having a gate, a drain, and a source, second transistor having a gate, a drain, and a source;

bias circuit operably coupled to provide a bias voltage to the first end of the impedance ladder;

current source operably coupled to the source of the second transistor and to a supply return, wherein the drains of the first and second transistors are operably coupled to the tap of the impedance ladder, wherein the source of the first transistor is operably coupled to a supply source, wherein the gates of the first and second transistors are operably coupled to receive the first type of input signal from the digital interface module when the multi-function interface is in the first mode.

5. The multi-function interface of claim 3, wherein the configurable driver module further comprises:

first transistor having a gate, a drain, and a source; and second transistor having a gate, a drain, and source, wherein the source of the first transistor is operably coupled to a supply voltage, wherein the drain of the first transistor is operably coupled to the first end of the impedance ladder, wherein the drain of the second transistor is operably coupled to the second end of the impedance ladder, wherein the source of the second transistor is operably coupled to a supply return, and wherein the gates of the first and second transistors are operably coupled to receive the second type of input signal from the digital interface when the multi-function interface is in the second mode.

6. The multi-function interface of claim 1, wherein the first type of input signal and the second type of input signal each further comprise a differential signal.

7. The multi-function interface of claim 6, wherein the digital interface module further comprises:

first digital logic circuitry operable to provide a first leg of the first type of differential input signal to the configurable driver when a control signal is of a first digital value;

second digital logic circuitry operable to provide a second leg of the first type of differential input signal to the configurable driver when the control signal is of the first digital value;

third digital logic circuitry operable to provide the a first leg of the second type of differential input signal to the configurable driver when the control signal is of a second digital value;

fourth digital logic circuitry operable to provide the second leg of the second type of differential input signal to the configurable driver when the control signal is of the second digital value.

8. The multi-function interface of claim 7, wherein the configurable output impedance module further comprises:

first impedance ladder having a first end, a second end, and a tap, wherein the tap of the first impedance ladder provides a first leg of a differential output of the multi-function interface; and second impedance ladder having a first end, a second end, and a tap, wherein the tap of the second impedance ladder provides a second leg of the differential output of the multi-function interface.

9. The multi-function interface of claim 8, wherein the configurable driver module further comprises:

first transistor having a gate, a drain, and a source;

second transistor having a gate, a drain, and a source;

third transistor having a gate, a drain, and a source;

fourth transistor having a gate, a drain, and a source;

bias circuit operably coupled to provide a bias voltage to the first end of the first impedance ladder and to the first end of the second impedance ladder;

current source operably coupled to the sources of the second and fourth transistors and to a supply return, wherein the drains of the first and second transistors are operably coupled to the tap of the first impedance ladder, wherein the sources of the first and third transistors are operably coupled to a supply source, wherein the drains of the third and fourth transistors are operably coupled to the tap of the second impedance ladder, wherein the gates of the first and second transistors are operably coupled to receive a first leg of the first type of differential input signal from the digital interface module when the multi-function interface is in the first mode, and wherein the gates of the third and fourth transistors are operably coupled to receive a second leg of the first type of differential input signal from the digital interface module when the multi-function interface is in the first mode.

10. The multi-function interface of claim 8, wherein the configurable driver module further comprises:

first transistor having a gate, a drain, and a source;

second transistor having a gate, a drain, and a source, wherein the source of the first transistor is operably coupled to a supply voltage, wherein the drain of the first transistor is operably coupled to the first end of the first impedance ladder, wherein the drain of the second transistor is operably coupled to the second end of the first impedance ladder, wherein the source of the second transistor is operably coupled to a supply return, and wherein the gates of the first and second transistors are operably coupled to receive a first leg of the second type of differential input signal from the digital interface when the multi-function interface is in the second mode;

third transistor having a gate, a drain, and a source; and fourth transistor having a gate, a drain, and a source, wherein the source of the third transistor is operably coupled to the supply voltage, wherein the drain of the third transistor is operably coupled to the first end of the second impedance ladder, wherein the drain of the fourth transistor is operably coupled to the second end of the second impedance ladder, wherein the source of the fourth transistor is operably coupled to the supply return, and wherein the gates of the third and fourth transistors are operably coupled to receive a second leg of the second type of differential input signal from the digital interface when the multi-function interface is in the second mode.

11. The multi-function interface of claim 1 further comprises:

the first mode being in accordance with a System Packet Interface (SPI) protocol; and the second mode being in accordance with a HyperTransport (HT) protocol.

12. The multi-function interface of claim 11, wherein the configurable driver further comprises:

being configured as a current steering driver when the multi-function interface is in the first mode; and being configured as a class A amplifier or class AB amplifier when the multi-function interface is in the second mode.

13. A multiple processor integrated circuit comprises:

a plurality of processing units;

cache memory;

memory controller operably coupled to system memory;

internal bus operably coupled to the plurality of processing units, the cache memory and the memory controller;

packet manager operably coupled to the internal bus;

node controller operably coupled to the internal bus;

first configurable packet-based interface;

second configurable packet-based interface; and switching module operably coupled to the packet manager, the node controller, the first configurable packet-based interface, and the second configurable packet-based interface, wherein each of the first and second configurable packet-based interfaces include a input/output module and a media access control (MAC) layer module, wherein the input/output module includes:

digital interface module operably coupled to pass a first type of input signal when the multi-function interface is in a first mode and operably coupled to pass a second type of input signal when the multi-function interface is in a second mode;

configurable driver module operably coupled to amplify the first type of input signal when the multi-function interface is in the first mode and to amplify the second type of input signal when the multi-function interface is in the second mode; and configurable output impedance module operably coupled to the configurable driver module to provide a first output impedance when the multi-function interface is in the first mode and to provide a second output impedance when the multi-function interface is in the second mode.

14. The multiple processor integrated circuit of claim 13, wherein the digital interface module further comprises:

first digital logic circuitry operable to provide the first type of input signal to the configurable driver when a control signal is of a first digital value; and second digital logic circuitry operable to provide the second type of input signal to the configurable driver when the control signal is of a second digital value.

15. The multiple processor integrated circuit of claim 14, wherein the configurable output impedance module further comprises:

impedance ladder having a first end, a second end, and a tap, wherein the tap provides an output of the multi-function interface.

16. The multiple processor integrated circuit of claim 15, wherein the configurable driver module further comprises:

first transistor having a gate, a drain, and a source, second transistor having a gate, a drain, and a source;

bias circuit operably coupled to provide a bias voltage to the first end of the impedance ladder;

current source operably coupled to the source of the second transistor and to a supply return, wherein the drains of the first and second transistors are operably coupled to the tap of the impedance ladder, wherein the source of the first transistor is operably coupled to a supply source, wherein the gates of the first and second transistors are operably coupled to receive the first type of input signal from the digital interface module when the multi-function interface is in the first mode.

17. The multiple processor integrated circuit of claim 15, wherein the configurable driver module further comprises:

first transistor having a gate, a drain, and a source; and second transistor having a gate, a drain, and a source, wherein the source of the first transistor is operably coupled to a supply voltage, wherein the drain of the first transistor is operably coupled to the first end of the impedance ladder, wherein the drain of the second transistor is operably coupled to the second end of the impedance ladder, wherein the source of the second transistor is operably coupled to a supply return, and wherein the gates of the first and second transistors are operably coupled to receive the second type of input signal from the digital interface when the multi-function interface is in the second mode.

18. The multiple processor integrated circuit of claim 13, wherein the first type of input signal and the second type of input signal each further comprise a differential signal.

19. The multiple processor integrated circuit of claim 18, wherein the digital interface module further comprises:

first digital logic circuitry operable to provide a first leg of the first type of differential input signal to the configurable driver when a control signal is of a first digital value;

second digital logic circuitry operable to provide a second leg of the first type of differential input signal to the configurable driver when the control signal is of the first digital value;

third digital logic circuitry operable to provide the a first leg of the second type of differential input signal to the configurable driver when the control signal is of a second digital value;

fourth digital logic circuitry operable to provide the second leg of the second type of differential input signal to the configurable driver when the control signal is of the second digital value.

20. The multiple processor integrated circuit of claim 19, wherein the configurable output impedance module further comprises:

first impedance ladder having a first end, a second end, and a tap, wherein the tap of the first impedance ladder provides a first leg of a differential output of the multi-function interface; and second impedance ladder having a first end, a second end, and a tap, wherein the tap of the second impedance ladder provides a second leg of the differential output of the multi-function interface.

21. The multiple processor integrated circuit of claim 20, wherein the configurable driver module further comprises:

first transistor having a gate, a drain, and a source, second transistor having a gate, a drain, and a source;

third transistor having a gate, a drain, and a source;

fourth transistor having a gate, a drain, and a source;

bias circuit operably coupled to provide a bias voltage to the first end of the first impedance ladder and to the first end of the second impedance ladder;

current source operably coupled to the sources of the second and fourth transistors and to a supply return, wherein the drains of the first and second transistors are operably coupled to the tap of the first impedance ladder, wherein the sources of the first and third transistors are operably coupled to a supply source, wherein the drains of the third and fourth transistors are operably coupled to the tap of the second impedance ladder, wherein the gates of the first and second transistors are operably coupled to receive a first leg of the first type of differential input signal from the digital interface module when the multi-function interface is in the first mode, and wherein the gates of the third and fourth transistors are operably coupled to receive a second leg of the first type of differential input signal from the digital interface module when the multi-function interface is in the first mode.

22. The multiple processor integrated circuit of claim 20, wherein the configurable driver module further comprises:

first transistor having a gate, a drain, and a source;

second transistor having a gate, a drain, and a source, wherein the source of the first transistor is operably coupled to a supply voltage, wherein the drain of the first transistor is operably coupled to the first end of the first impedance ladder, wherein the drain of the second transistor is operably coupled to the second end of the first impedance ladder, wherein the source of the second transistor is operably coupled to a supply return, and wherein the gates of the first and second transistors are operably coupled to receive a first leg of the second type of differential input signal from the digital interface when the multi-function interface is in the second mode;

third transistor having a gate, a drain, and a source; and fourth transistor having a gate, a drain, and a source, wherein the source of the third transistor is operably coupled to the supply voltage, wherein the drain of the third transistor is operably coupled to the first end of the second impedance ladder, wherein the drain of the fourth transistor is operably coupled to the second end of the second impedance ladder, wherein the source of the fourth transistor is operably coupled to the supply return, and wherein the gates of the third and fourth transistors are operably coupled to receive a second leg of the second type of differential input signal from the digital interface when the multi-function interface is in the second mode.

23. The multiple processor integrated circuit of claim 13 further comprises:

the first mode being in accordance with a System Packet Interface (SPI) protocol; and the second mode being in accordance with a HyperTransport (HT) protocol.

24. The multiple processor integrated circuit of claim 23, wherein the configurable driver further comprises:

being configured as a current steering driver when the multi-function interface is in the first mode; and being configured as a class A amplifier or class AB amplifier when the multi-function interface is in the second mode.

25. A method for configuring a multi-function input/output interface, the method comprises:

determining a digital value of a control signal;

when the control signal has a first digital value, passing a first type of input signal;

driving the first type of input signal with a first impedance level to produce a first type of output drive;

when the control signal has a second digital value, passing a second type of input signal; and driving the second type of input signal with a second impedance level to produce a second type of output drive.

26. The method of claim 25 further comprises:

the first digital value indicating that the first type of input signal is formatted in accordance with a System Packet Interface (SPI) protocol; and the second digital value indicating that the second type of input signal is formatted in accordance with a Hyper-Transport (HT) protocol.

27. The method of claim 26 further comprises:

current steering the first type of input signal to produce a first type of output drive; and class A amplifying or class AB amplifying the second type of input signal to produce the second type of output drive.

28. An apparatus for configuring a multi-function input/output interface, the apparatus comprises:

means for determining a digital value of a control signal;

when the control signal has a first digital value, means for passing a first type of input signal;

means for driving the first type of input signal with a first impedance level to produce a first type of output drive;

when the control signal has a second digital value, means for passing a second type of input signal; and means driving the second type of input signal with a second impedance level to produce a second type of output drive.

29. The apparatus of claim 28 further comprises:

the first digital value indicating that the first type of input signal is formatted in accordance with a System Packet Interface (SPI) protocol; and the second digital value indicating that the second type of input signal is formatted in accordance with a Hyper-Transport (HT) protocol.

30. The method of claim 26 further comprises:

means for current steering the first type of input signal to produce a first type of output drive; and means for class A amplifying or class AB amplifying the second type of input signal to produce the second type of output drive.

* * * * *